United States Patent
Ai et al.

(10) Patent No.: US 10,249,700 B2
(45) Date of Patent: Apr. 2, 2019

(54) OLED ARRAY SUBSTRATE, DISPLAY APPARATUS AND METHOD FOR REPAIRING DARK SPOT THEREON

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yu Ai, Beijing (CN); Xuewu Xie, Beijing (CN); Shi Sun, Beijing (CN); Bowen Liu, Beijing (CN); Chengpeng Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/756,301

(22) PCT Filed: Jul. 12, 2017

(86) PCT No.: PCT/CN2017/092560
§ 371 (c)(1),
(2) Date: Feb. 28, 2018

(87) PCT Pub. No.: WO2018/120754
PCT Pub. Date: Jul. 5, 2018

(65) Prior Publication Data
US 2019/0027549 A1 Jan. 24, 2019

(30) Foreign Application Priority Data
Dec. 28, 2016 (CN) .......................... 2016 1 1237544

(51) Int. Cl.
*H01L 51/56* (2006.01)
*H01L 27/32* (2006.01)
(Continued)

(52) U.S. Cl.
CPC ...... *H01L 27/3276* (2013.01); *H01L 27/3248* (2013.01); *H01L 27/3262* (2013.01);
(Continued)

(58) Field of Classification Search
CPC ............ H01L 27/3276; H01L 27/2348; H01L 27/3262
See application file for complete search history.

(56) References Cited

U.S. PATENT DOCUMENTS

| 9,281,352 B2 * | 3/2016 | Choi ................... H01L 27/3272 |
| 9,553,138 B2 * | 1/2017 | Kim .................... H01L 27/3276 |
| 2010/0207106 A1 | 8/2010 | Lhee et al. | |

FOREIGN PATENT DOCUMENTS

| CN | 102437112 A | 5/2012 |
| CN | 103792747 A | 5/2014 |

OTHER PUBLICATIONS

International Search Report and Written Opinion dated Oct. 12, 2017; PCT/CN2017/092560.

* cited by examiner

*Primary Examiner* — Seahvosh Nikmanesh
(74) *Attorney, Agent, or Firm* — Ladas & Parry LLP

(57) ABSTRACT

An organic light-emitting diode (OLED) array substrate, a display apparatus and a method for repairing a dark spot of the display apparatus or the OLED array substrate are provided by the embodiments of the present disclosure. The OLED array substrate includes: power lines, a connection component, a pixel structure disposed in a pixel region, and the pixel structure includes a driving transistor, and an OLED device. The OLED device includes a first electrode
(Continued)

and a second electrode, and the first electrode is electrically connected with the first source/drain electrode of the driving transistor; the connection component is configured to electrically insulating the first electrode from the power lines before repairing the OLED array substrate; and the connection component is further configured to electrically connect the first electrode (anode or cathode) with the power lines in a case of repairing the OLED array substrate.

20 Claims, 7 Drawing Sheets

(51) Int. Cl.
     *H01L 51/52*      (2006.01)
     *H01L 27/12*      (2006.01)

(52) U.S. Cl.
     CPC ...... *H01L 51/5206* (2013.01); *H01L 51/5221* (2013.01); *H01L 51/56* (2013.01); *H01L 27/124* (2013.01); *H01L 27/3213* (2013.01); *H01L 2251/568* (2013.01)

OLED ARRAY SUBSTRATE, DISPLAY APPARATUS AND METHOD FOR REPAIRING DARK SPOT THEREON

TECHNICAL FIELD

Embodiments of the present disclosure relate to an organic light-emitting diode (OLED) array substrate, a display apparatus and a method for repairing a dark spot on the display apparatus or the OLED array substrate.

BACKGROUND

Organic light-emitting diode (OLED) display devices are active light-emitting apparatuses, compared to the mainstream thin film transistor liquid crystal displays (TFT-LCDs), OLED devices have many advantages, such as high contrast, wide angle of view, low power consumption and light weight, and OLED devices have been drawn more and more attentions.

The OLED device includes an anode, a cathode and a light-emitting layer disposed between the anode and the cathode. In a case that a voltage is applied between the anode and the cathode, the holes and electrons move to the light-emitting layer, and the holes and the electrons are combined in the light-emitting layer. In the process of manufacturing the OLED device, the residual impurities may cause local short circuit between the anode and the cathode, so that the dark spot defect is generated. In the process of using the OLED device, a size of the dark spot may be gradually increased, until the whole pixel unit becomes a dark pixel that cannot be lit, which results in the decline of the reliability of the OLED device. Or due to the defects in the thin film transistor (TFT) and other components in the pixel structure (for example, a defect of short circuit between the anode and the power line), then the OLED display has a bright spot defect.

For the dark spot defect, in the conventional repairing method, the impurities are removed from the short circuited region by a laser, but this method may damage the display region surrounding the short circuited region; for the bright spot defect, the conventional repairing method is to make a backup line on an array substrate, or the data line is cut off firstly, then the end of the TFT close to the OLED is connected to the constant potential by welding, so that the cathode and the anode of the OLED keep an equal potential to eliminate the bright spot defects, but this method occupies the wiring space and then affects the aperture ratio.

SUMMARY

At least one embodiment of the present disclosure provides an organic light-emitting diode (OLED) array substrate, and the OLED array substrate includes: a base substrate; a power line and a connection component both disposed on the base substrate; a pixel structure disposed in a pixel region, wherein the pixel structure includes a driving transistor and an OLED device; wherein the driving transistor includes a gate electrode, a first source/drain electrode and a second source/drain electrode; the first source/drain electrode is connected with the OLED device; and the second source/drain electrode is connected to the power line; the OLED device includes a first electrode and a second electrode, and the first electrode is electrically connected with the first source/drain electrode of the driving transistor, the connection component is configured to electrically insulate the first electrode from the power line before repairing the OLED array substrate; the connection component is further configured to electrically connect the first electrode with the power line in a case of repairing the OLED array substrate.

For example, in the array substrate provided by at least one embodiment of the present disclosure, the connection component has a first end and a second end, the first end is electrically connected with the first electrode or arranged to be welded with the first electrode, the second end is electrically connected with the second source/drain electrode or the power line, or arranged to be welded with the second source/drain electrode or the power line, and the first electrode is not electrically connected with the power line and the connection component before welding.

For example, in the array substrate provided by at least one embodiment of the present disclosure, the connection component includes a switching element, a first end of the switching element is electrically connected with the first electrode, and a second end of the switching element is electrically connected with the power line.

For example, in the array substrate provided by at least one embodiment of the present disclosure, the switching element is a thin film transistor.

For example, in the array substrate provided by at least one embodiment of the present disclosure, the connection component is in a same layer as the power line, the first end is arranged to be welded with the first electrode, and the second end is electrically connected with the power line.

For example, in the array substrate provided by at least one embodiment of the present disclosure, the connection component is in a same layer as the first electrode, and the first end is electrically connected with the first electrode, and the second end is able to be welded with the power line.

For example, in the array substrate provided by at least one embodiment of the present disclosure, the connection component is in a same layer as the second source/drain electrode, the first end is arranged to be welded with the first electrode, and the second end is electrically connected with the second source/drain electrode.

For example, in the array substrate provided by at least one embodiment of the present disclosure, the connection component has a linear structure, in a direction parallel to the base substrate, the connection component extends outside at least one of the power line, the first electrode and the second source/drain electrode; in a direction perpendicular to the base substrate, the connection component is overlapped with the first electrode and overlapped with at least one of the power line and the second source/drain electrode.

For example, the array substrate provided by at least one embodiment of the present disclosure, further includes a gate line and a data line, wherein the pixel structure further includes a switching transistor, the switching transistor is connected to the gate line and the data line, the gate electrode of the driving transistor is connected to the switching transistor, the power line and the gate line are in a same layer, and the power line and the gate line are electrically insulated from each other.

For example, the array substrate provided by at least one embodiment of the present disclosure, further includes gate lines and data lines, wherein the pixel structure further includes a switching transistor, the switching transistor is connected to the gate lines and the data lines, the gate electrode of the driving transistor is connected to the switching transistor, the power line and the gate line are in different layers, and the power line is in a planar shape.

For example, in the array substrate provided by at least one embodiment of the present disclosure, the first electrode is an anode, the second electrode is a cathode, or the first electrode is a cathode, and the second electrode is an anode.

For example, in the array substrate provided by at least one embodiment of the present disclosure, the anode is made of transparent conductive material, the cathode is made of conductive metal material, the power line is made of conductive metal material, and the connection component is made of transparent conductive material or conductive metal material.

For example, at least one embodiment of the present disclosure further provides a display apparatus, and the display apparatus includes any one of the OLED array substrate described above.

For example, at least one embodiment of the present disclosure further provides a method for repairing a dark spot of any one of the OLED array substrate described above, or a method for repairing a dark spot of the display apparatus described above, and the method includes: electrically connecting the power line with the first electrode; applying a voltage to the first electrode by the power line to cause the first electrode and the second electrode to be no longer electrically connected with each other, electrically insulating the power line from the first electrode by the connection component.

For example, in the method for repairing a dark spot provided by at least one embodiment of the present disclosure, the connection component corresponding to the pixel structure to be repaired is irradiated for a first time by laser to electrically connect the power line with the first electrode.

For example, in the method for repairing a dark spot provided by at least one embodiment of the present disclosure, in a case that the connection component is in a same layer as the power line, and the first end is able to be welded with the first electrode, and the second end is electrically connected with the power line, the irradiation for the first time by laser is to weld the first end and the first electrode.

For example, in the method for repairing a dark spot provided by at least one embodiment of the present disclosure, in a case that the connection component is in a same layer as the first electrode, the first end is electrically connected with the first electrode, and the second end is able to be welded with the power line, the irradiation for the first time by laser is to weld the second end and the power line.

For example, in the method for repairing a dark spot provided by at least one embodiment of the present disclosure, in a case that the connection component is in a same layer as the second source/drain electrode, the first end is able to be welded with the first electrode, and the second end is electrically connected with the second source/drain electrode, the irradiation for the first time by laser is to weld the first end and the first electrode.

For example, in the method for repairing a dark spot provided by at least one embodiment of the present disclosure, the connection component corresponding to the pixel structure to be repaired is irradiated for a second time by laser to electrically insulate the power line from the first electrode.

For example, at least one embodiment of the present disclosure further provides a method for repairing a dark spot of at least one of the OLED array substrate described above, and the method includes: providing a conductive signal for the thin film transistor to electrically connect the power line with the first electrode; applying a voltage to the first electrode by the power line to cause the first electrode and the second electrode to be no longer electrically connected with each other; and providing a disconnection signal for the thin film transistor so that the power line and the first electrode are no longer electrically connected with each other by the thin film transistor.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

Figure 1:
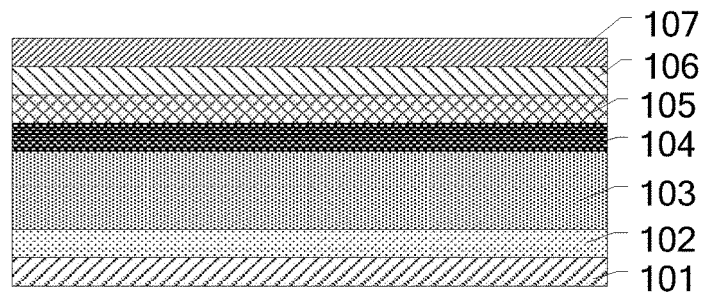
FIG. 1 is a schematic diagram of a layer structure of an organic light-emitting diode (OLED)

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the object which is described is changed, the relative position relationship may be changed accordingly.

The sizes of each pattern in the OLED array substrate in the present disclosure are usually micrometer or smaller in actual products, for the sake of clarity, the sizes of the structures in the drawings of the embodiment of the present disclosure are magnified. Unless otherwise specified, the drawings do not represent the actual size and proportion.

In the process of preparing an organic light-emitting diode (OLED) array substrate (for example, depositing each films, coating photoresist, stripping photoresist and forming film patterns, etc), a dark spot phenomenon may occur, and the reason is that the impurities conduct the anode with the cathode of the OLED device in the pixel structure, so that the voltage at both ends of the OLED device is zero, which makes the light-emitting layer in the OLED device cannot emit light normally and the pixel structure presents the corresponding dark spot phenomenon.

For example, FIG. 1 is a schematic diagram of a layer structure of an organic light-emitting diode (OLED). As illustrated in FIG. 1, the OLED device includes a base substrate 101, an anode 102, a light-emitting layer 103 and a cathode 104 disposed on the base substrate 101, according to the requirement, the OLED device may further include an inorganic insulating layer 105, an organic insulating layer 106 and a covering plate 107 disposed on the base substrate. For example, in a case that the OLED device is pressed by an external force, the inorganic insulating layer and/or the organic insulating layer can act as a buffer. Because the light-emitting layer 103 is sensitive to water and oxygen, the inorganic insulating layer and/or the organic insulating layer can play the role of absorbing water or blocking water and oxygen, so as to protect the light-emitting layer 103. For example, the luminescence principle of the OLED is that in a case that a voltage between the anode and the cathode of the OLED is greater than a turn-on voltage of the light-emitting diode, the light-emitting layer 103 will be excited and emit light.

Figure 2:
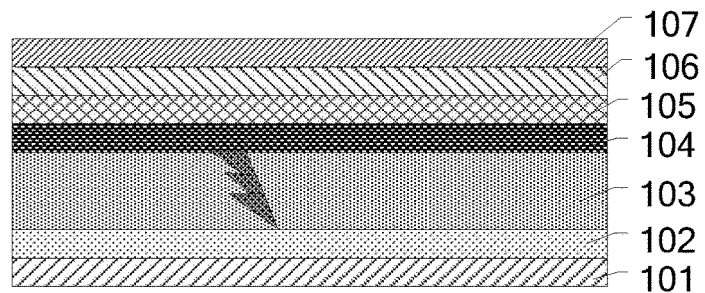
FIG. 2 is a schematic diagram of a structure that an anode is connected with a cathode by conductive impurities in the OLED device of FIG. 1.

FIG. 2 is a schematic diagram of a structure that an anode is connected with a cathode of the OLED device by conductive impurities. As illustrated in FIG. 2, in a case that the residual conductive impurities connects the anode with the cathode of the OLED, there is no voltage difference between the anode and the cathode of the OLED, so that the organic light-emitting layer cannot emit light, the corresponding pixel structure will show a dark spot defect. Due to the limitation of the ratio of width to length of a thin film transistor (TFT) design, the current through the thin film transistor is usually at a level of microampere, and the current required to burn the conductive impurities is at a level of milliampere, therefore, the conductive impurities cannot be ablated by the current applied to the anode or the cathode of the OLED through the TFT which is driven by the power line. In the present disclosure, by forming a passive matrix structure, the anode or the cathode of the OLED is electrically connected to the power line, so that the power voltage is directly applied to the anode or the cathode of the OLED and a large current flowing through the conductive impurities is formed, therefore the conductive impurities is ablated.

In order to avoid the adverse effects of the OLED display caused by the dark spot defect, the dark spot defect needs repair. The embodiment of the present disclosure provides an organic light-emitting diode (OLED) array substrate, and the OLED array substrate includes a base substrate; a power line and a connection component both disposed on the base substrate; a pixel structure disposed in a pixel region, and the pixel structure includes a driving transistor and an OLED device; the driving transistor includes a gate electrode, a first source/drain electrode and a second source/drain electrode; the first source/drain electrode is connected with the OLED device; and the second source/drain electrode is connected to the power line; the OLED device includes a first electrode and a second electrode, and the first electrode is electrically connected with the first source/drain electrode of the driving transistor; the connection component is configured to electrically insulate the first electrode from the power line before the OLED array substrate is repaired; the connection component is further configured to electrically connect the first electrode with the power line in a case of repairing the OLED array substrate.

The organic light-emitting diode (OLED) array substrate can connect the first electrode (an anode or a cathode) of the OLED device in the pixel structure of the OLED array substrate to the power line directly, in this way, the input end and output end of the driving transistor are short circuited, that is the source electrode and the drain electrode of driving transistor are short circuited, a high voltage is applied to the first electrode of the OLED device by the power line, so that an instantaneous large current is generated between the first electrode and the second electrode of the OLED device having a dark spot defect, the large current flows through the conductive impurities between the first electrode and the second electrode and ablates the conductive impurities, so that the conductive impurities no longer connect the first electrode with the second electrode, which turns a dark spot into a bright spot. Then, the first electrode of the OLED array substrate is isolated from the power line, so that the input end and the output end of the drive transistors are no longer short circuited, and the high voltage of the power line cannot be applied directly to the first electrode to eliminate the bright spot, so that the corresponding pixels return to normal. The method of repairing dark spot has the advantages of simple operation, and no adverse impact on the surrounding circuits.

Figure 3:
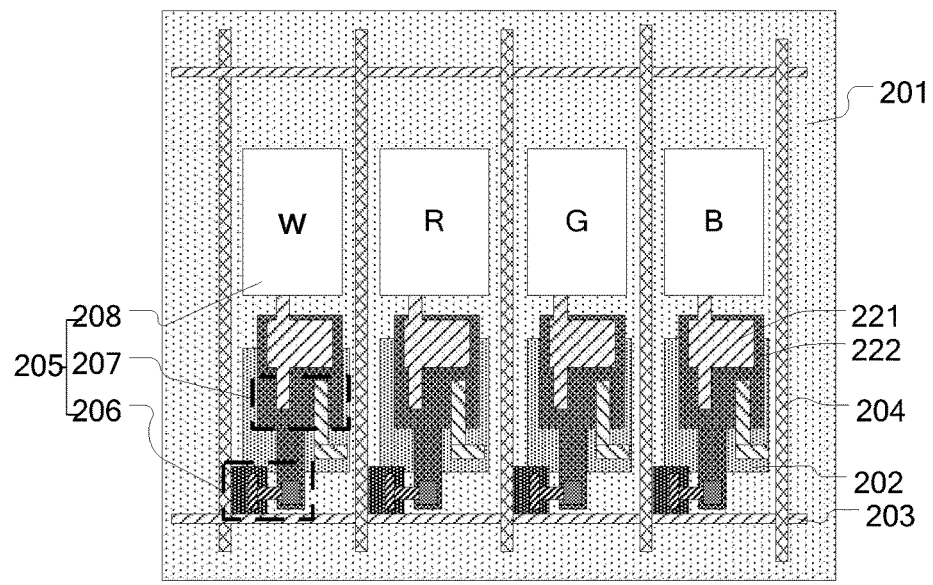
FIG. 3 is a schematic diagram of a planar structure of an organic light-emitting diode (OLED) array substrate provided by an embodiment of the present disclosure.
Figure 4A:
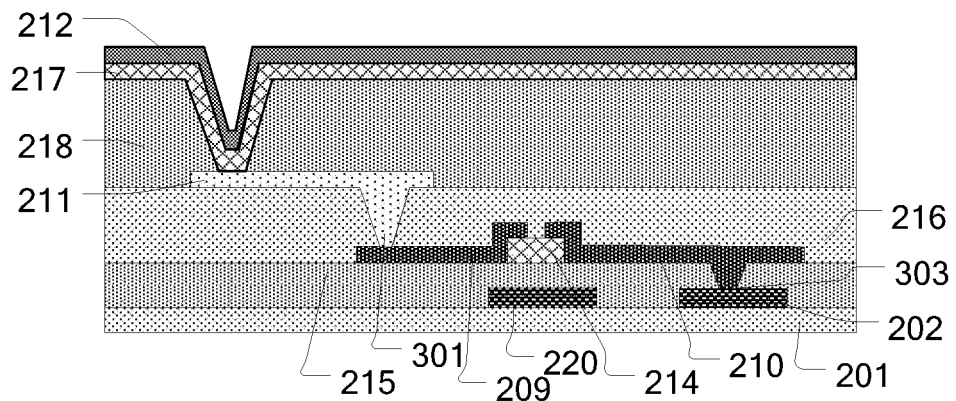
FIG. 4a is a schematic diagram of a partial section structure of an organic light-emitting diode (OLED) array substrate provided by an embodiment of the present disclosure.
Figure 4B:
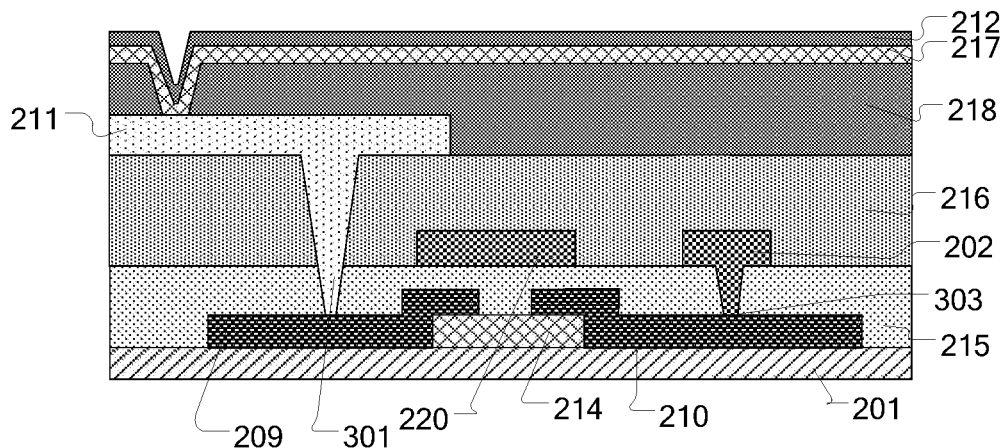
FIG. 4b is a schematic diagram of a partial section structure of another organic light-emitting diode (OLED) array substrate provided by an embodiment of the present disclosure.

An organic light-emitting diode (OLED) array substrate is provided by one embodiment of the present disclosure, for example, FIG. 3 is a schematic diagram of a planar structure of an organic light-emitting diode (OLED) array substrate provided by an embodiment of the present disclosure, FIG. 4a is a schematic diagram of a partial section structure of an organic light-emitting diode (OLED) array substrate provided by an embodiment of the present disclosure, and FIG. 4b is a schematic diagram of a partial section structure of another organic light-emitting diode (OLED) array substrate provided by an embodiment of the present disclosure.

As illustrated in FIG. 3 and FIG. 4a and FIG. 4b, the OLED array substrate includes: a base substrate 201, power lines 202 on the base substrate 201, a connection component (not shown in FIG. 3, FIG. 4A and FIG. 4B), gate lines 203 and data lines 204, pixel structures 205 disposed in the regions defined by the intersected gate lines 203 and the data lines 204, and each of the pixel structures 205 includes a switching transistor 206, a driving transistor 207, and an OLED device 208. The switching transistor 206 is connected to the gate lines 203 and the data lines 204, the driving transistor 207 includes a gate electrode 220, a first source/drain electrode 209 and a second source/drain electrode 210, the gate electrode 220 is connected to the switching transistor 206, and the first source/drain electrode 209 is connected with the OLED device 208, the second source/drain electrode 210 is connected to the power line 202, the OLED device 208 includes a first electrode 211 and a second electrode 212, and the first electrode 211 is electrically connected with the first source/drain electrode 209 of the driving transistor 207.

The gate electrode of the switching transistor 206 is connected to the gate lines 203, the input end (for example one of the source electrode and the drain electrode) of the switching transistor 206 is connected to the data lines 204, and the output end (for example the other one of the source electrode and the drain electrode) of the switching transistor 206 is connected to the gate electrode 220 of the driving transistor 207. The light-emitting layer of the OLED device 208 is sandwiched between the first electrode 211 and the second electrode 212. The first source/drain electrode 209 in the driving transistor 207 is one of the source electrode and the drain electrode, and the second source/drain electrode 210 is the other one of the source electrode and the drain electrode.

For example, in FIG. 3, although four pixel structures arranged in parallel with each other are shown in FIG. 3, they are used to emit white light (W), red light (R), green light (G) and blue light (B) respectively, those skilled in the art should be understood that the array substrate in the embodiment of the present disclosure is not limited to include the four pixel structures as illustrated in FIG. 3, but can include more, and is not limited to the specific colors of the light emitted by the OLED device.

Each of the pixel structures further includes a storage capacitance, and the storage capacitance includes a third electrode and a fourth electrode opposite to each other. As illustrated in FIG. 3, the third electrode 221 and fourth electrode 222 are in a block shape, and a dielectric layer made of insulating material is disposed between the third electrode 221 and fourth electrode 222.

For example, the OLED array substrate includes a display region and a peripheral region outside the display region. The display region may also be called as an AA (Active Area), which is commonly used to display, and the peripheral region can be used to arrange the driving circuits and the encapsulation structure of the display panel, etc. The above mentioned pixel structure, the gate lines and the data lines are disposed in the display region. For example, in the OLED array substrate, in addition to the gate lines, the data lines and other connecting wires, the detection compensation wires for connecting the pixel units to the detection integrated circuits may be provided, and the detection compensation wires may also be arranged in the display region.

For example, FIG. 4a is a schematic diagram of a partial section structure of an organic light-emitting diode (OLED) array substrate, the driving transistor in FIG. 4a is a thin film transistor with a bottom gate structure. As illustrated in FIG. 4a, the driving transistor includes a base substrate 201, a gate electrode 220 and power lines 202 both disposed on the base substrate 201, for example, the power lines 202 are made of a same material as the gate electrode 220, and the power lines 202 and the gate electrode 220 are arranged in a same layer. A gate insulating layer 215 is formed on the gate electrode 220, an active layer 214 is formed on the gate insulating layer 215, a first source/drain electrode 209 and a second source/drain electrode 210 are formed on the active layer 214, a passivation layer 216 is arranged on the first source/drain electrode 209 and the second source/drain electrode 210. A first electrode 211, a pixel definition layer 218, a light-emitting layer 217 and a second electrode 212 are arranged on the passivation layer 216, the first electrode 211 is electrically connected with the first source/drain electrode 209 through the first via hole 301 penetrating the passivation layer 216, and the power lines 202 are electrically connected with the second source/drain electrode 210 through the third via hole 303 disposed in the gate insulating layer 215.

For example, FIG. 4b is a schematic diagram of a partial section structure of another organic light-emitting diode (OLED) array substrate, the driving transistor in FIG. 4b is a thin film transistor with a top gate structure. As illustrated in FIG. 4b, the driving transistor includes a base substrate 201, an active layer 214 disposed on the base substrate 201, a first source/drain electrode 209 and a second source/drain electrode 210 disposed on the gate insulating layer 215, a gate electrode 220 and power lines 202 both disposed on the gate insulating layer 215, for example, the power lines 202 are made of a same material as the gate electrode 220, and the power lines 202 and the gate electrode 220 are arranged in a same layer. A passivation layer 216 is arranged on the gate electrode 220. A first electrode 211, a pixel definition layer 218, a light-emitting layer 217 and a second electrode 212 are arranged on the passivation layer 216, the first electrode 211 is electrically connected with the first source/drain electrode 209 through the first via hole 301 penetrating the passivation layer 216, and the power lines 202 are electrically connected with the second source/drain electrode 210 through the third via hole 303 disposed in the gate insulating layer 215.

It should be noted that, if the power lines 202 and the gate electrode 220 are arranged in a same layer, the power lines and the gate lines may be formed in the same patterning process, and the power lines are not connected with the gate lines, so that the process step is saved and the production cost is reduced.

Figure 4C:
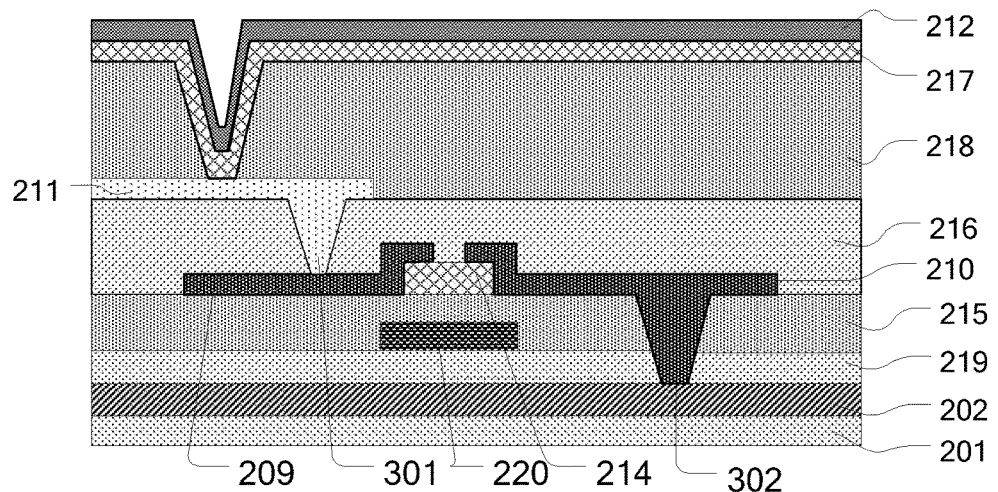
FIG. 4c is a schematic diagram of a partial section structure of another organic light-emitting diode (OLED) array substrate provided by an embodiment of the present disclosure.

For example, the power lines 202 and the gate electrode 220 may be arranged in different layers. Considering that the position of the gate lines is relatively close to the driving transistor and the storage capacitance, the power lines may be arranged below the pixel structure and at least partially overlapped with the pixel structure. For example, FIG. 4c is a schematic diagram of a partial section structure of another organic light-emitting diode (OLED) array substrate. The structure shown in FIG. 4c is different from the structure shown in FIG. 4a, the difference is that the power lines 202 in FIG. 4c are arranged below the gate electrode 220. In the present example, the power lines are not limited to be arranged below the gate electrode 220, and the power lines may also be arranged on the gate electrode. As illustrated in FIG. 4c, an insulating layer 219 is formed between the power lines 202 and the pixel structure, a second via hole 302 is disposed in the insulating layer 219, and the power lines 202 are connected with the driving transistor through the second via hole 302. Arranging the power lines 202 at the bottom of the pixel structure can increase the aperture ratio of the OLED array substrate and reduce the impedance from the pixels in the display region to the power lines.

The power lines 202 are arranged to have a wider region, which overlaps the region where the power lines are located, the region where the driving transistor is located and the region where the storage capacitor is located on the direction perpendicular to the OLED array substrate, and power lines region with a large area in a horizontal direction may be formed in the regions including the gate lines, the driving transistors, and the storage capacitors. For example, the power line is an electrode in a planar shape that is made from a metal mesh (rather than a single bar or a single line), and the electrode in a planar shape made from the metal mesh includes a plurality of mesh holes. The power line in a planar shape can reduce the voltage drop of the power line (IR drop), so that the energy consumption of the OLED array substrate is reduced. It should be explained that, the power line in a planar shape refers to the power line has a size and an extension range in both the width direction and the length direction of the pixel structure.

For example, in one example, each column of pixel structure (sub-pixel) corresponds to a power line in a planar shape, so that multiple of power lines in planar shapes are connected to each other to form an integrated structure, which makes the area of power lines larger, thereby further reducing the voltage drop of the power lines (IR drop) and reducing the energy consumption of the OLED array substrate.

Figure 4D:
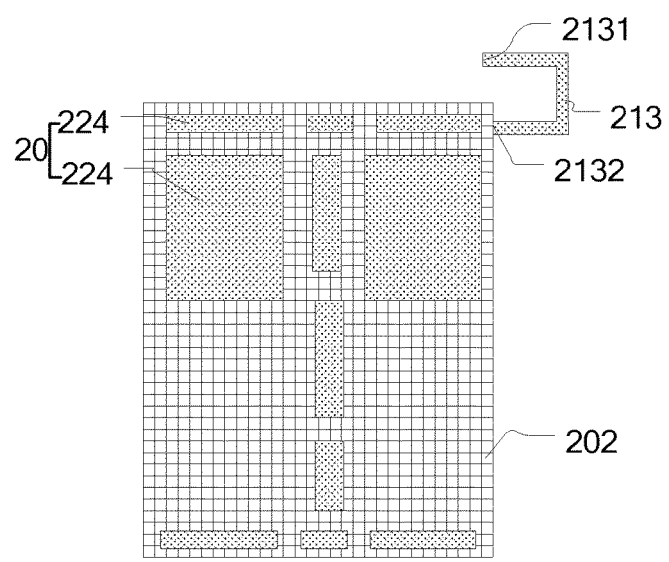
FIG. 4d is a schematic diagram of a planar structure of the power line and the connection component in FIG. 4c.

For example, in one example, the region of the power line in a planar shape, which corresponds to the pixel structure, the gate lines and the data lines, is provided with at least one hollow structure. It should be noted that, the size of the hollow structure corresponds to a total size of the pixel structure, the gate lines and the data lines; the size of the hollow structure is larger than the size of the mesh in the metal mesh. For example, FIG. 4d is a schematic diagram of a planar structure of the power line and the connection component in FIG. 4c. As illustrated in FIG. 4d, the main purpose that the region of the power line in a planar shape corresponds to the pixel structure provided with a hollow structure is to prevent shading by metal lines, and thus influence the transmittance of light, that is, the power line in a planar shape provided with at least one hollow structure corresponding to the pixel structure can increase the transmittance of light and make full use of the incident light; and the surface power line 202 provided with at least one hollow structure corresponding to the gate lines and the data lines can prevent capacitance formed between the power line in a planar shape and the gate lines or the data lines. For example, as illustrated in FIG. 4d, the hollow structure 20 may include a plurality of discontinuous hollow sub-structures 224 (that is a plurality of hollow sub-structures are separated from each other), in this way, the power line in a planar shape is divided into a plurality of parallel regions, and the voltage drop of the power line can also be greatly reduced. As illustrated in FIG. 4d, the connection component 213 is formed in a same layer as the power lines 202, and made from the same material as the power lines 202. The connection component 213 is protruded out of the power lines 202, and the connection component 213 is in linear shape, which is convenient for subsequent welding and cutting.

In the embodiments of the present disclosure, the power line is not limited to the above planar structure, it can also be a linear structure parallel to the data lines, and one power line is provided for each column of pixel structures (sub-pixels).

For example, as illustrated in FIG. 4a to FIG. 4c, a pixel definition layer 218 is formed on the first electrode 211 of the OLED device, and the light-emitting layer 217 is formed in the opening portion of the pixel definition layer 218, the second electrode 212 is formed on the light-emitting layer 217, the second electrode 212 of the OLED device is, for example, grounded. For example, the first electrode 211 and the second electrode 212 are the anode and the cathode of the OLED device, respectively.

It should be noted that, each of the pixel definition regions in the pixel definition layer corresponds to a pixel electrode, each column of the pixel definition sub-regions in the pixel definition structure is a pixel definition sub-region of a same color, as illustrated in FIG. 3, the pixel definition sub-regions include a white pixel definition sub-region W, a red pixel definition sub-region R, a green pixel definition sub-region G, and a blue pixel definition sub-region B. A pixel definition sub-region is connected to the adjacent pixel definition sub-region of a same color. Each of the pixel definition sub-regions is connected to two adjacent pixel definition sub-regions of the same color at most.

Figure 5:
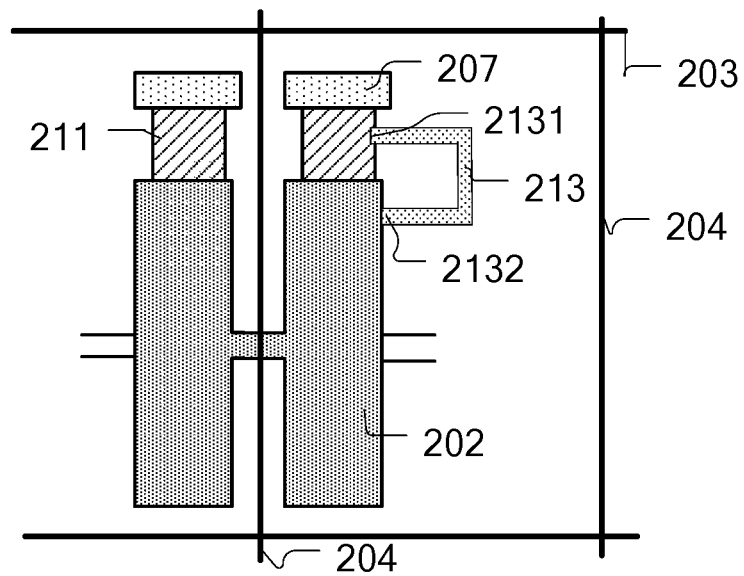
FIG. 5 is a schematic diagram of a planar structure of a connection component provided by an embodiment of the present disclosure.

For example, FIG. 5 is a schematic diagram of a planar structure of a connection component provided by an embodiment of the present disclosure, FIG. 5 is a schematic diagram of the planar structure of the organic light-emitting diode (OLED) array substrate in FIG. 4a taken from the bottom of FIG. 4a. FIG. 5 takes the arrangement that the power line and the connection component are disposed in a same layer for example. As illustrated in FIG. 5, the connection component 213 and the power line 202 are made of a same material in the same patterning process, thus the process is saved and the production cost is reduced. In this way, the first end 2131 of the connection component 213 is able to be welded with the first electrode 211, and the second end 2132 of the connection component 213 is electrically connected with the power line 202.

It should be noted that, the second end 2132 of the connection component 213 may also be electrically connected with the second source/drain electrode. Accordingly, the first end 2131 of the connection component 213 may further be arranged to be electrically connected with the first electrode 211; the second end 2132 of the connection component 213 is arranged to be welded with the second source/drain electrode or the power line 202, and the connection component 213 does not electrically connect the first electrode 211 to the power line 202 before welding.

For example, as illustrated in FIG. 5, in the pixel region defined by the intersected gate lines 203 and data lines 204, each of the pixel units corresponds to a connection component 213, the first electrode 211 of the OLED device is electrically connected with the second source/drain electrode of the driving transistor 207 (not shown).

For example, as illustrated in FIG. 5, the connection component 213 is in a linear structure, and the connection component 213 is composed of a single linear structure, and each of the pixel structure regions is provided with one connection component 213.

For example, in a direction parallel to the base substrate, the connection component is extended outside at least one of the power lines, the first electrode, and the second source/drain electrode; in a direction perpendicular to the base substrate, the connection component overlaps with the first electrode, and overlaps with at least one of the power lines and the second source/drain electrode. It should be noted that, the connection component extended outside at least one of the power lines, the first electrode, and the second source/drain electrode is relative to a pixel structure region. The descriptions that the connection component overlaps with the first electrode, and overlaps with at least one of the power lines and the second source/drain electrode include overlapping in space and connecting in a same plane, that is "overlaps" refers to the projections of the connection component and the first electrode overlapped with each other on the base substrate, and the projections of the connection component and the at least one of the power lines and the second source/drain electrode overlapped with each other on the base substrate, which meets the operating conditions that the first electrode is electrically connected with the power line.

For example, as illustrated in FIG. 5, the connection component 213 extends outside the power line 202 and the first electrode 211, which facilitates to subsequent laser cutting for the connection component. The connection component 213 and the first electrode 211 are located at different layers, and the first end 2131 of the connection component 213 is overlapped with the first electrode in space, so that the first end 2131 of the connection component 213 is able to be welded with the first electrode 211, and the second end of the connection component 213 is located in the same plane with the power line 202 and is connected to the power line 202.

Figure 6:
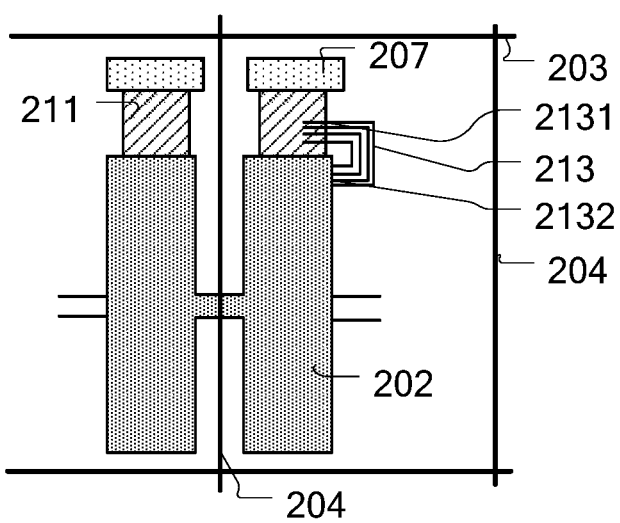
FIG. 6 is a schematic diagram of a planar structure of a connection component provided by another embodiment of the present disclosure.

For example, FIG. 6 is a schematic diagram of a planar structure of a connection component provided by another embodiment of the present disclosure, the connection component 213 is a composite structure composed of multiple linear structures, each of the pixel structure regions is provided with a connection component 213 with a composite structure. The connection component 213 is arranged to be a composite structure of multiple linear structures to narrow the width of multiple linear structures, which is beneficial to the subsequent welding and the electrical connection between the first electrode 211 and the power line 202, and is also beneficial to the subsequent laser cutting process.

Exemplary, the connection component and the first electrode may also be arranged in a same layer, the connection component and the first electrode are made of a same material in the same patterning process, thus the process is saved and the production cost is reduced. In this way, the first end of the connection component is connected with the first electrode, and the second end of the connection component is able to be welded with the power line.

Exemplary, the connection component and the second source/drain electrode may also be arranged in a same layer, the first end of the connection component is able to be welded with the first electrode, and the second end of the connection component is connected with the second source/drain electrode.

For example, the connection component is in a linear structure, in a direction parallel to the base substrate, the connection component is extended outside at least one of the power lines, the first electrode, and the second source/drain electrode. For example, as illustrated in FIG. 5, the connection component protrudes outside the power line, which facilitates to subsequent cutting for disconnecting the power lines and the first electrode.

For example, in the process of detecting the organic light-emitting diode (OLED) array substrate, when the dark spot phenomenon occurs, as illustrated in FIG. 5 and FIG. 6, the first electrode 211 can be electrically connected with the power line 202 by laser irradiation, and an instantaneous current (a current of milliampere) is generated between the anode and cathode of the OLED device in the pixel structure having a dark spot defect. The large current flows through the conductive impurities between the anode and cathode of the OLED device and ablates the conductive impurities, so that the conductive impurities no longer connect the anode and cathode of the OLED device, which turns a dark spot into a bright spot. Then the first electrode of the OLED array substrate is isolated from the power line (the two are disconnected from each other and no longer connected with each other), and the high voltage of the power line cannot be applied directly to the first electrode (the anode or the cathode) to eliminate the bright spot, so that the corresponding pixels return to normal.

Figure 7:
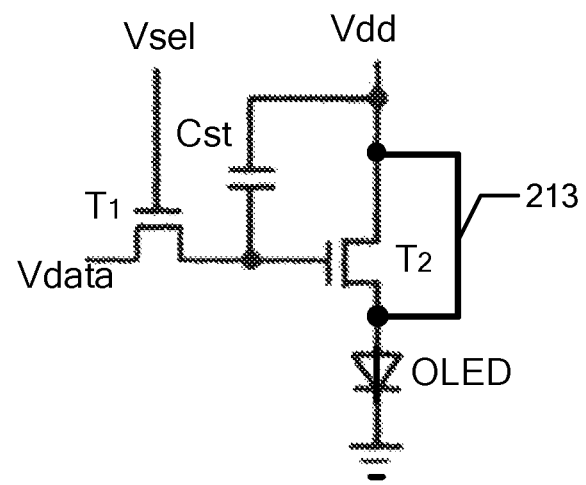
FIG. 7 is a circuit diagram that a driving transistor is short circuited provided by an embodiment of the present disclosure.

For example, FIG. 7 is a circuit diagram provided by an embodiment of the present disclosure when a driving transistor is short circuited. For example, as illustrated in FIG. 7, the pixel structure of the OLED array substrate includes a switching transistor T1, a driving transistor T2, a storage capacitor Cst, and an organic light-emitting diode (OLED). Before the driving transistor T2 is short circuited, the current flows through the power line Vdd through the driving transistor T2 and then flows to the organic light-emitting diode (OLED). After the input end and the output end of the driving transistor T2 being short circuited, the high voltage applied to the power line Vdd is directly applied to the two ends of the OLED. The large current (the current of milliampere) does not pass through (bypasses) the driving transistor T2, and directly flows through the connection component 213 to the organic light-emitting diode (OLED). The conductive impurities between the anode and the cathode of the organic light-emitting diode (OLED) is melted by the current of milliampere, so that a voltage difference between the anode and the cathode of the organic light-emitting diode returns to normal. For example, in the circuit diagram as illustrated in FIG. 7, the first end of the connection component 213 is electrically connected with the first electrode of the organic light-emitting diode (OLED), or arranged to be welded with the first electrode, the first electrode is an anode of the organic light-emitting diode (OLED), and the second end of the connection component 213 is connected with the power line Vdd.

Figure 8A:
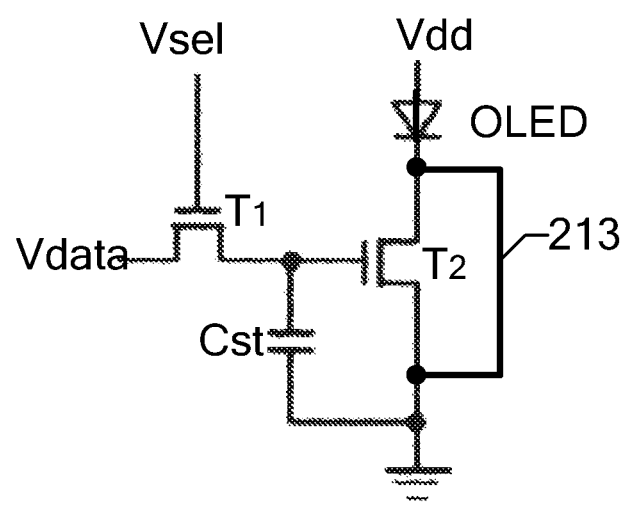
FIG. 8a is a circuit diagram that a driving transistor is short circuited provided by another embodiment of the present disclosure.

For example, FIG. 8a is a circuit diagram provided by another embodiment of the present disclosure when a driving transistor is short circuited. For example, as illustrated in FIG. 8a, the pixel structure of the OLED array substrate includes a switching transistor T1, a driving transistor T2, a storage capacitor Cst, and an organic light-emitting diode (OLED). The OLED is located at the input end of the driving transistor T2, which overcomes the influence of the change of the OLED turn-on voltage on the current of the driving transistor T2. Before the input end and the output end of the driving transistor T2 is short circuited, the current flows through the power line Vdd through the driving transistor T2 and then flows from the organic light-emitting diode (OLED) to the driving transistor T2. After the driving transistor T2 being short circuited, the high voltage applied to the power line (Vdd) is directly applied to both ends of OLED, the large current (the current of milliampere) flows to the light-emitting diode (OLED), the current of milliampere ablates the conductive impurities between the anode and the cathode of the organic light-emitting diode (OLED), so that a voltage difference between the anode and the cathode of the organic light-emitting diode returns to normal. In the circuit diagram as illustrated in FIG. 8a, the first end of the connection component 213 is electrically connected with the first electrode of the organic light-emitting diode (OLED), or arranged to be welded with the first electrode, the first electrode is a cathode of the organic light-emitting diode (OLED).

For example, in another embodiment, the connection component includes a switching element, a first end of the switching element is electrically connected with the first electrode, and a second end of the switching element is electrically connected with the power line.

For example, the switching element is a thin film transistor. A conductive signal is provided for a thin film transistor to electrically connect the power line with the first electrode, so that an instantaneous current (a current of milliampere) is generated between the anode and cathode of the OLED device in the pixel structure having a dark spot defect. The large current flows through the conductive impurities between the anode and cathode of the OLED device and ablates the conductive impurities, so that the conductive impurities no longer connect the anode and cathode of the OLED device, which turns a dark spot into a bright spot. A disconnecting signal is provided for a thin film transistor, so that the power line is no longer connected with the first electrode by the thin film transistor, and the high voltage of the power line cannot be applied directly to the first electrode (the anode or the cathode) to eliminate the bright spot, so that the corresponding pixels return to normal.

Figure 8B:
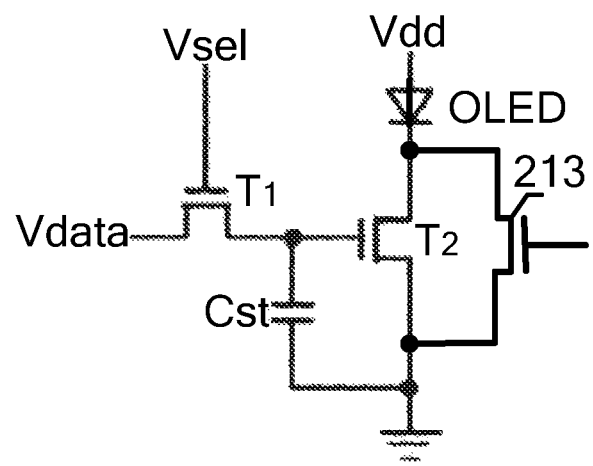
FIG. 8b is a circuit diagram that a driving transistor is short circuited provided by still another embodiment of the present disclosure.

For example, FIG. 8b is a circuit diagram provided by another embodiment of the present disclosure when a driving transistor is short circuited. For example, as illustrated in FIG. 8b, the pixel structure of the OLED array substrate includes a switching transistor T1, a driving transistor T2, a storage capacitor Cst, and an organic light-emitting diode (OLED). In addition, the pixel structure of the OLED array substrate further includes a switching element used as a connection component 213, and the switching element is a thin film transistor. The OLED is located at the input end of the driving transistor T2, which overcomes the influence of the change of the OLED turn-on voltage on the current of the driving transistor T2. Before the input end and the output end of the driving transistor T2 is short circuited, the current flows through the organic light-emitting diode (OLED) through the power line Vdd, and then flows from the organic light-emitting diode (OLED) to the driving transistor T2. After the driving transistor 12 being short circuited, the high voltage applied to the power line (Vdd) is directly applied to both ends of OLED, the large current (the current of milli-ampere) flows to the light-emitting diode OLED, the current of milliampere ablates the conductive impurities between the anode and the cathode of the organic light-emitting diode (OLED), so that a voltage difference between the anode and the cathode of the organic light-emitting diode returns to normal. In the circuit diagram as illustrated in FIG. 8b, the first end of the connection component 213 is electrically connected with the first electrode of the organic light-emitting diode (OLED), and the second end of the connection component 213 is connected with the power line.

It should be noted that, the connection component 213 in FIG. 7 can also be a switching element, the switching element is a thin film transistor. The principle may refer to the relative descriptions of the above FIG. 8a.

Figure 9A:
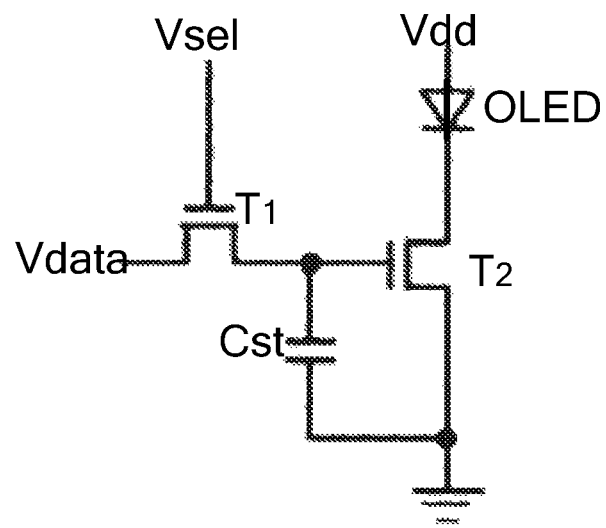
FIG. 9a is a schematic diagram of a 2T1C pixel circuit by an embodiment of the present disclosure.
Figure 9B:
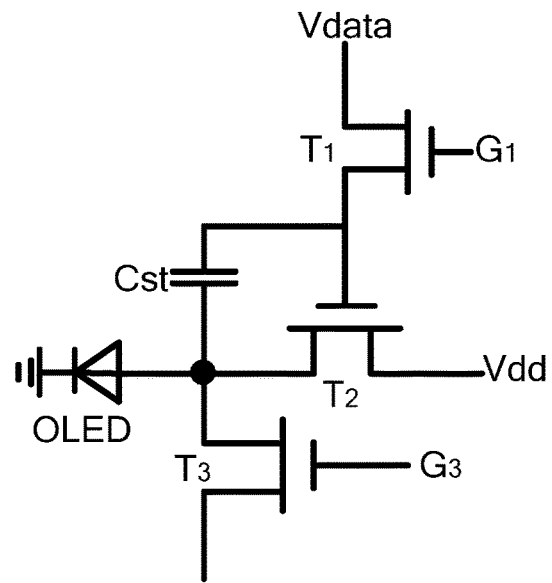
FIG. 9b is a schematic diagram of a 3T1C pixel circuit by an embodiment of the present disclosure.

For example, FIG. 9a is a schematic diagram of a 2T1C pixel circuit provided by an embodiment of the present disclosure. It can be seen from FIG. 3 and FIG. 9a, in addition to the switching transistor T1 and the driving transistor 12, the pixel structure 205 further includes a storage capacitor Cst, one end of the storage capacitor Cst is connected to the first source/drain electrode 209 of the driving transistor, and the other end of the storage capacitor Cst is connected to the drain electrode of the switching transistor T1. In an embodiment of the present disclosure, the pixel circuit may also be a 3T1C structure or a 4T2C structure etc. For example, FIG. 9b is a schematic diagram of a 3T1C pixel circuit by an embodiment of the present disclosure, in addition to the above mentioned switching transistor T1 and the driving transistor T2, a detection transistor T3 may also be included, in addition, other compensation transistors, reset transistors and others may also be included, which is not limited in the embodiments of the present disclosure.

For example, the base substrate may be a transparent glass substrate or a transparent plastic substrate.

For example, one of the first electrode and the second electrode is an anode and the other one is a cathode. The electrode materials for the anode include indium tin oxide (ITO), indium zinc oxide (IZO), indium gallium oxide (IGO), gallium zinc oxide (GZO), zinc oxide (ZnO), indium oxide (In2O3), aluminum zinc oxide (AZO) and carbon nanotubes; the electrode materials for the cathode include magnesium aluminum alloy (MgAl), lithium aluminum alloy (LiAl), or single metal, such as magnesium, aluminum, lithium, etc.

For example, the material for forming the light-emitting layer of the OLED device may be selected according to the color of the emitted light. The material of the light-emitting layer includes a fluorescent light-emitting material or a phosphorescent light-emitting material. At present, in general, a doping system is adopted, that is, a doping material is mixed into a host luminescent material to obtain a usable luminescent material. For example, the host luminescent material may be a metal compound material, an anthracene derivative, an aromatic diamine compound, a triphenylamine compound, an aromatic triamine compound, a biphenylenediamine derivative, or a triarylamine polymer, etc.

For example, the material of the power line includes a conductive metal material, for example, copper based metals, chromium based metals. For example, copper (Cu), copper molybdenum alloy (CuMo), copper titanium alloy (CuTi), copper molybdenum titanium alloy (CuMoTi), copper molybdenum tungsten alloy (CuMoW), copper molybdenum niobium (CuMoNb) and the like, chromium molybdenum alloy (CrMo), chrome titanium alloy (CrTi), chrome molybdenum titanium alloy (CrMoTi) and the like.

For example, the material of the connection component includes a conductive material such as a transparent conductive material, a conductive metal, or the like. For example, the transparent conductive material for forming the connection component includes indium tin oxide (ITO), indium zinc oxide (IZO), indium gallium oxide (IGO), zinc oxide (GZO), aluminum zinc (AZO) and carbon nanotubes etc. The conductive metal material for forming the connection component includes copper based metals, for example, copper (Cu), copper molybdenum alloy (CuMo), copper titanium alloy (CuTi), copper molybdenum titanium alloy (CuMoTi), copper molybdenum tungsten alloy (CuMoW), copper molybdenum niobium (CuMoNb) and the like, or the conductive metal material for forming the connection component includes chromium based metals, for example, chromium molybdenum alloy (CrMo), chrome titanium alloy (CrTi), chrome molybdenum titanium alloy (CrMoTi) and the like.

The embodiment of the present disclosure further provides a display apparatus, which includes any one of the above mentioned organic light-emitting diode (OLED) array substrate, and may further include a gate driving circuit, a data driving circuit, a power and the like. The gate line is connected with the gate driving circuit, the data line is connected with the data driving circuit, each of the power lines is connected with the power source. The display apparatus may be any product or component having a display function such as an OLED panel, a cell phone, a tablet computer, a television, a display, a notebook computer, a digital photo frame and a navigator.

The organic light-emitting diode (OLED) array substrate included in the display apparatus in the embodiment of the present disclosure has a same structure as that of the organic light-emitting diode (OLED) array substrate shown in any one of the above mentioned FIG. 4 *a*, FIG. 4 *b* and FIG. 4 *c*, and the technical effect and the principle are the same, which is omitted herein. It should be noted that, according to the requirements, it is not limited to the layer structure in FIG. 4*a* to FIG. 4*c*, but other layer structures may be added to FIG. 4*a* to FIG. 4*c*.

In addition, the display apparatus may adopt a bottom emission mode or a top emission mode, and may also adopt a bottom-top dual emission mode. For example, the display apparatus includes the OLED array substrate shown in FIG. 4*a*, FIG. 4*b* or FIG. 4*c*, and the OLED array substrate is in a bottom emission mode. If the position of the anode and the cathode in FIG. 4*a*, FIG. 4*b* or FIG. 4*c* is reversed, then the top emission mode is adopted.

Figure 10:
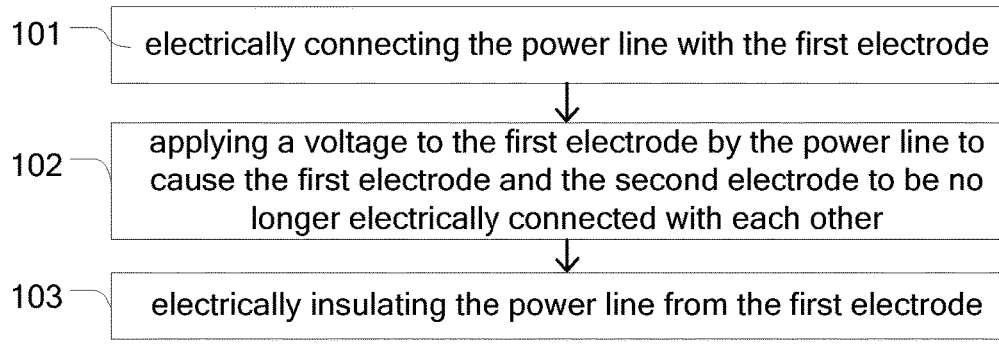
FIG. 10 is a flow diagram of a method for repairing a dark spot provided by an embodiment of the present disclosure.

The embodiments of the present disclosure further provide a method for repairing a dark spot of any one of the above organic light-emitting diode (OLED) array substrates and any one of the display apparatuses. FIG. 10 is a flow diagram of a method for repairing a dark spot provided by an embodiment of the present disclosure, as illustrated in FIG. 10, the repairing method comprises the following steps.

Step 101: electrically connecting the power line with the first electrode;

Step 102: applying a voltage to the first electrode by the power line to cause the first electrode and the second electrode to be no longer electrically connected with each other;

Step 103: electrically insulating the power line from the first electrode.

For example, the connection component corresponding to the pixel structure to be repaired is irradiated for the first time by laser to connect the power line and the first electrode. The power line and the first electrode are melted by controlling the energy and time of the laser irradiation to electrically connect the power line with the first electrode. For example, the coordinates of the dark spots can be detected by yield testing, then the dark spots can be repaired.

The first example: in a case that the power line is connected with the first electrode and the material of the connection component is a conductive metal material, the energy of the first laser irradiation is from 1300 mJ to 1600 mJ, and the time of the first laser irradiation is from 6 seconds to 10 seconds. For example, the energy of the first laser irradiation is approximately 1500 mJ and the time of the first laser irradiation is approximately 8 seconds. For example, in a case that the connection component is in a same layer as the power line, and the first end of the connection component is able to be welded with the first electrode, and the second end is electrically connected with the power line, the first laser irradiation is used to weld the first end of the connection component with the first electrode. Since the metallic material is opaque, the laser energy absorption rate is high during the process of laser welding of the power line and the first electrode, which makes the welding easier, so that the purpose of improving the dark spot repairing rate is achieved. In addition, since the connection component made of metallic material is opaque, it is convenient to mark the point to be repaired, which enables better positioning when repairing the display apparatus.

For example, in a case that the display apparatus includes the structure of the organic light-emitting diode (OLED) array substrate as illustrated in FIG. 4*a*, a gate insulating layer and a passivation layer are interposed between the power line and the first electrode. When the power line and the first electrode are laser welded, only the gate insulating layer with a thickness of 100 nm to 300 nm and the passivation layer with a thickness of 100 nm to 300 nm are disposed between the power line and the first electrode. For example, the material of the gate insulating layer and the passivation layer is silicon nitride, silicon oxynitride and the like. In a case that the connection component and the power line are disposed in a same layer and the material of the connection component is metal material, the organic light-emitting diode (OLED) array substrate in FIG. 4*a* required to be irradiated with the first laser, the display apparatus is inverted (the laminated structure of the organic light-emitting diode (OLED) array substrate in FIG. 4*a* is inverted), laser light is incident from a side of the base substrate, laser light passes through the gate insulating layer and the passivation layer, a channel is formed in the gate insulating layer and the passivation layer to allow a connection component (metal material) in a melted state to flow along the channel to the first electrode, the melted metal material in the channel is solidified to electrically connect the first electrode with the power line.

The second example: in a case that the power line is connected with the first electrode and the material of the connection component is a transparent conductive material, the energy of the first laser irradiation is from 1200 mJ to 1400 mJ, and the time of the first laser irradiation is from 6 seconds to 10 seconds. For example, the energy of the first laser irradiation is approximately 1300 mJ and the time of the first laser irradiation is approximately 8 seconds. In a case that the connection component is in a same layer as the power line, and the first end of the connection component is electrically connected with the first electrode, and the second end is able to be welded with the power line, the first laser irradiation is used to weld the second end of the connection component and the power line. The material of the connection component is a transparent metal oxide. The laser energy required for melting a transparent metal oxide (for example, indium tin oxide, indium zinc oxide, etc.) is lower than the energy required for melting metal materials.

For example, in a case that the display apparatus includes the structure of the organic light-emitting diode (OLED) array substrate as illustrated in FIG. 4*a*, a gate insulating layer with a thickness of 100 nm to 300 nm and a passivation layer with a thickness of 100 nm to 300 nm are disposed between the power line and the first electrode. In a case that the connection component and the power line are disposed in a same layer and the material of the connection component is transparent conductive material, the organic light-emitting diode (OLED) array substrate in FIG. 4*a* required to be irradiated with the first laser, laser light is incident from a side of the second electrode (the cathode), by precisely controlling the energy of the first laser irradiation, the laser passes through the second electrode (the second electrode cannot be melted by the first laser irradiation) and the pixel definition layer to reach the first electrode. The first laser irradiation ablates the first electrode, the laser passes through the gate insulating layer and the passivation layer, and a channel is formed in the gate insulating layer and the passivation layer to allow the melted connection component (transparent conductive material) to flow along the channel to the power line, the melted transparent conductive material in the channel is solidified to electrically connect the first electrode with the power line.

It should be noted that, in the second example, it is also possible to make the connection component (the transparent conductive material) in the melted state flow along the channel to the second source/drain electrode. The melted transparent conductive material in the channel is solidified to electrically connect the first electrode with the second source/drain electrode. Because the second source/drain electrode is electrically connected to and the power line, in this way, the first electrode is electrically connected with the power line.

The third example: in a case that the connection component is in a same layer as the second source/drain electrode, the first end of the connection component is arranged to be welded with the first electrode, and the second end of the connection component is electrically connected with the second source/drain electrode, the irradiated for the first time by laser is to weld the first end with the first electrode.

For example, in the first example, the second example, and the third example, before performing the first laser irradiation, the method further comprises: marking a laser welding mark on the connection component to laser weld the connection component more accurately.

For example, after the power line and the first electrode are electrically connected with each other, a voltage is applied to the first electrode (the anode or the cathode) through the power line, so that an instantaneous large current is generated at the position having a dark spot defect. The large current flows through the conductive impurities between the anode and cathode of the OLED device and ablates the conductive impurities, so that the conductive impurities no longer connect the anode and cathode of the OLED device, which turns a dark spot into a bright spot. Then the first electrode is isolated from the second electrode.

For example, the connection component corresponding to the pixel structure to be repaired is irradiated for the second time by laser to insulate the power line from the first electrode, in order to eliminate the bright spot phenomenon, then the pixel structure returns to normal.

For example, in a case that the material of the connection component is a transparent conductive material, the energy of the second laser irradiation is from 700 mJ to 900 mJ, and the time of the second laser irradiation is from 6 seconds to 10 seconds. For example, the energy of the second laser irradiation is approximately 800 mJ, and the time of the second laser irradiation is approximately 8 seconds. In a case that the material of the connection component is a conductive metal material, the energy of the second laser irradiation is from 1000 mJ to 1200 mJ, and the time of the second laser irradiation is from 6 seconds to 10 seconds. For example, the energy of the second laser irradiation is approximately 1100 mJ, and the time of the second laser irradiation is approximately 8 seconds. The magnitude of the energy and the time of the second laser irradiation are controlled to melt the connection component. For example, the connection component has an extending linear structure, and the linear structure extending from the connection component is cut by the second laser irradiation.

For example, the connection component has a thickness of 100 nm to 700 nm, in a case that the connection component is in a same layer as the power line, the first electrode or the second source/drain electrode layer, the thickness of the connection component may be the same as the thickness of the corresponding layer formed in the same layer. For example, in a case that the power line, the first electrode and the second source/drain electrode layer has a thickness of 600 nm, 200 nm and 400 nm, respectively, the thickness of the connection component may also be 600 nm, 200 nm or 400 nm. It should be noted that, the energy and the time of the first laser irradiation and the second laser irradiation has a positive correlation with the thickness of the connection component.

For example, in another embodiment, the connection component includes a switching element, a first end of the switching element is electrically connected with the first electrode, and a second end of the switching element is electrically connected with the power line.

For example, the switching element is a thin film transistor. A conductive signal is provided for a thin film transistor to electrically connect the power line with the first electrode, so that an instantaneous current (a current of milliampere) is generated between the anode and cathode of the OLED device in the pixel structure having a dark spot defect. The large current flows through the conductive impurities between the anode and cathode of the OLED device and ablates the conductive impurities, so that the conductive impurities no longer connect the anode and cathode of the OLED device, which turns a dark spot into a bright spot. A disconnecting signal is provided for a thin film transistor, so that the power line is no longer connected with the first electrode by the thin film transistor, and the high voltage of the power line cannot be applied directly to the first electrode (the anode or the cathode) to eliminate the bright spot, so that the corresponding pixels return to normal.

The organic light-emitting diode (OLED) array substrate, the display apparatus and the method for repairing a dark spot of the display apparatus provided by the embodiments of the present disclosure have at least one of the following beneficial effects: (1) when performing a dark spot repairing on the display apparatus provided by the present disclosure, the first electrode (an anode or a cathode) of the OLED device is connected with the power line directly, therefore the driving transistor is short circuited, then a high voltage is applied to the power line, so that an instantaneous large current is generated between the first electrode and the second electrode of the OLED device having a dark spot defect, the large current flows through the conductive impurities between the first electrode and the second electrode and ablates the conductive impurities, so that the conductive impurities no longer connect the anode with the cathode of the OLED device, which turns a dark spot into a bright spot. Then the first electrode of the OLED array substrate is isolated from the power line, so that the high voltage of the power line cannot be applied directly to the first electrode to eliminate the bright spot, so that the corresponding pixels return to normal; (2) the dark spot repairing method has the advantages of simple operation, and no adverse impact on the surrounding circuits; (3) the dark spot repairing method is not only suitable for repairing the dark spot before attaching the polarizer, but also suitable for repairing the dark spot after the polarizer is attached.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

The present application claims the priority of the Chinese Patent Application No. 201611237544.5 filed on Dec. 28, 2016, the entirety of which is incorporated herein by reference as a part of the present application.

What is claimed is:

1. An organic light-emitting diode (OLED) array substrate, comprising:
   a base substrate;
   a power line and a connection component both disposed on the base substrate;
   a pixel structure disposed in a pixel region, wherein the pixel structure comprises a driving transistor and an OLED device;
   wherein the driving transistor comprises a gate electrode, a first source/drain electrode and a second source/drain electrode; the first source/drain electrode is connected with the OLED device; and the second source/drain electrode is connected to the power line;
   the OLED device comprises a first electrode and a second electrode, and the first electrode is electrically connected with the first source/drain electrode of the driving transistor;
   the connection component is configured to electrically insulate the first electrode from the power line before repairing the OLED array substrate; and
   the connection component is further configured to electrically connect the first electrode with the power line in a case of repairing the OLED array substrate.

2. The OLED array substrate according to claim 1, wherein the connection component comprises a first end and a second end, the first end is electrically connected with the first electrode or arranged to be welded with the first electrode, the second end is electrically connected with the second source/drain electrode or the power line, or arranged to be welded with the second source/drain electrode or the power line, and the first electrode is electrically disconnected with the power line before welding.

3. The OLED array substrate according to claim 1, wherein the connection component comprises a switching element, a first end of the switching element is electrically connected with the first electrode, and a second end of the switching element is electrically connected with the power line.

4. The OLED array substrate according to claim 3, wherein the switching element is a thin film transistor.

5. The OLED array substrate according to claim 2, wherein the connection component is in a same layer as the power line, the first end is arranged to be welded with the first electrode, and the second end is electrically connected with the power line.

6. The OLED array substrate according to claim 2, wherein the connection component is in a same layer as the first electrode, and the first end is electrically connected with the first electrode, and the second end is able to be welded with the power line.

7. The OLED array substrate according to claim 2, wherein the connection component is in a same layer as the second source/drain electrode, the first end is arranged to be welded with the first electrode, and the second end is electrically connected with the second source/drain electrode.

8. The OLED array substrate according to claim 1, wherein the connection component has a linear structure, in a direction parallel to the base substrate, the connection component extends outside at least one of the power line, the first electrode and the second source/drain electrode;
   in a direction perpendicular to the base substrate, the connection component is overlapped with the first electrode and overlapped with at least one of the power line and the second source/drain electrode.

9. The OLED array substrate according to claim 8, further comprising a gate line and a data line, wherein the pixel structure further comprises a switching transistor, the switching transistor is connected to the gate line and the data line, the gate electrode of the driving transistor is connected to the switching transistor, the power line and the gate line are in a same layer, and the power line and the gate line are electrically insulated from each other.

10. The OLED array substrate according to claim 8, further comprising a gate line and a data line, wherein the pixel structure further comprises a switching transistor, the switching transistor is connected to the gate line and the data line, the gate electrode of the driving transistor is connected to the switching transistor, the power line and the gate line are in different layers, and the power line is in a planar shape.

11. The OLED array substrate according to claim 1, wherein the first electrode is an anode, the second electrode is a cathode, or the first electrode is a cathode, and the second electrode is an anode.

12. The OLED array substrate according to claim 11, wherein the anode is made of transparent conductive material, the cathode is made of conductive metal material, the power line is made of conductive metal material, and the connection component is made of transparent conductive material or conductive metal material.

13. A display apparatus, comprising the OLED array substrate according to claim 1.

14. A method for repairing a dark spot of the OLED array substrate according to claim 1, or a method for repairing a dark spot of the display apparatus according claim 13, comprising:
   electrically connecting the power line with the first electrode;
   applying a voltage to the first electrode by the power line to cause the first electrode and the second electrode to be no longer electrically connected with each other;
   electrically insulating the power line from the first electrode by the connection component.

15. The method for repairing a dark spot according to claim 14, wherein the connection component corresponding to the pixel structure to be repaired is irradiated for a first time by laser to electrically connect the power line with the first electrode.

16. The method for repairing a dark spot according to claim 15, wherein in a case that the connection component is in a same layer as the power line, and a first end of the connection component is able to be welded with the first electrode, and a second end of the connection component is electrically connected with the power line, the irradiation for the first time by laser is to weld the first end and the first electrode.

17. The method for repairing a dark spot according to claim 15, wherein in a case that the connection component is in a same layer as the first electrode, a first end of the connection component is electrically connected with the first electrode, and a second end of the connection component is able to be welded with the power line, the irradiation for the first time by laser is to weld the second end and the power line.

18. The method for repairing a dark spot according to claim 15, wherein in a case that the connection component is in a same layer as the second source/drain electrode, a first end of the connection component is able to be welded with the first electrode, and a second end of the connection component is electrically connected with the second source/drain electrode, the irradiating for the first time by laser is to weld the first end and the first electrode.

19. The method for repairing a dark spot according to claim 14, wherein the connection component corresponding to the pixel structure to be repaired is irradiated for a second time by laser to electrically insulate the power line from the first electrode.

20. A method for repairing a dark spot of the OLED array substrate according to claim 4, comprising:
providing a conductive signal for the thin film transistor to electrically connect the power line with the first electrode;
applying a voltage to the first electrode by the power line to cause the first electrode and the second electrode to be no longer electrically connected with each other; and
providing a disconnection signal for the thin film transistor so that the power line and the first electrode are no longer electrically connected with each other by the thin film transistor.

* * * * *